United States Patent [19]

Bennett et al.

[11] Patent Number: 5,708,110

[45] Date of Patent: Jan. 13, 1998

[54] PRESSURE SENSITIVE ADHESIVES WITH GOOD LOW ENERGY SURFACE ADHESION

[75] Inventors: Greggory S. Bennett, Hudson, Wis.; Christopher A. Haak, Oakdale, Minn.

[73] Assignee: Minnesota Mining and Manufacturing Company, St. Paul, Minn.

[21] Appl. No.: 796,394

[22] Filed: Feb. 6, 1997

Related U.S. Application Data

[62] Division of Ser. No. 537,034, Sep. 29, 1995, Pat. No. 5,602,221, which is a continuation of Ser. No. 150,425, Nov. 10, 1993.

[51] Int. Cl.$^6$ ...................................................... C08F 218/00
[52] U.S. Cl. ...................... 526/307.7; 526/319; 526/282; 526/264; 526/270; 526/273; 526/313; 526/326; 526/318.44
[58] Field of Search ................................ 526/307.7, 319, 526/282, 264, 270, 273, 313, 326, 318.44

[56] References Cited

U.S. PATENT DOCUMENTS

| | | |
|---|---|---|
| 24,906 | 12/1859 | Ulrich . |
| 3,312,754 | 4/1967 | Marks et al. . |
| 3,340,224 | 9/1967 | Sherman et al. . |
| 3,406,087 | 10/1968 | Potter . |
| 3,491,070 | 1/1970 | Weaver . |
| 3,740,366 | 6/1973 | Sanderson et al. . |
| 3,922,464 | 11/1975 | Silver et al. . |
| 4,092,443 | 5/1978 | Green . |
| 4,181,752 | 1/1980 | Martens et al. . |
| 4,199,646 | 4/1980 | Hori et al. . |
| 4,223,067 | 9/1980 | Levens . |
| 4,243,500 | 1/1981 | Glennon . |
| 4,247,656 | 1/1981 | Janssen . |
| 4,252,593 | 2/1981 | Green . |
| 4,303,485 | 12/1981 | Levens . |
| 4,329,384 | 5/1982 | Vesley et al. . |
| 4,330,590 | 5/1982 | Vesley . |
| 4,335,171 | 6/1982 | Zenk . |
| 4,364,972 | 12/1982 | Moon . |
| 4,379,201 | 4/1983 | Heilmann et al. . |
| 4,391,687 | 7/1983 | Vesley . |
| 4,404,246 | 9/1983 | Charbonneau et al. . |
| 4,415,615 | 11/1983 | Esmay et al. . |
| 4,418,105 | 11/1983 | Stratton . |
| 4,418,120 | 11/1983 | Kealy et al. . |
| 4,421,822 | 12/1983 | Levens . |
| 4,447,579 | 5/1984 | Takagi et al. . |
| 4,503,200 | 3/1985 | Corley . |
| 4,513,039 | 4/1985 | Esmay . |
| 4,522,870 | 6/1985 | Esmay . |
| 4,548,862 | 10/1985 | Hartman . |
| 4,552,604 | 11/1985 | Green . |

(List continued on next page.)

FOREIGN PATENT DOCUMENTS

| | | |
|---|---|---|
| 252717 | 1/1988 | European Pat. Off. . |
| 0 303 430 A1 | 2/1989 | European Pat. Off. . |
| 0444354A2 | 9/1991 | European Pat. Off. . |
| 0511860A1 | 11/1992 | European Pat. Off. . |
| 0 546 746 A1 | 6/1993 | European Pat. Off. . |
| 57-172906 | 10/1982 | Japan . |
| 10680 | 1/1988 | Japan . |
| 64-87667 | 3/1989 | Japan . |
| 1-261479 | 10/1989 | Japan . |
| 1-315409 | 12/1989 | Japan . |
| 2-202571 | 8/1990 | Japan . |
| 3-292379 | 12/1991 | Japan . |
| 4-103685 | 4/1992 | Japan . |
| 4-114079 | 4/1992 | Japan . |
| 4-255779 | 9/1992 | Japan . |
| 5-310810 | 11/1993 | Japan . |
| 05 045 518 | 2/1994 | Japan . |
| 6-128544 | 5/1994 | Japan . |
| 833-995 | 7/1979 | U.S.S.R. . |
| WO 91/14461 | 10/1991 | WIPO . |
| WO 92/02577 | 2/1992 | WIPO . |
| WO 92/15651 | 9/1992 | WIPO . |
| WO 93/13147 | 7/1993 | WIPO . |
| WO 93/13148 | 7/1993 | WIPO . |

OTHER PUBLICATIONS

Disclosure re Samples Sent Out.
(Chem Abs; 118:60863y) Li, Shu Sheng, "Oil Absorptive Adhesives", *Zhanjie*, 1991, vol. 112, No. 6, pp. 19–22.
Fedors, Robert F., "A Method for Estimating Both the Solubility Parameters and Molar Volumes of Liquids", *Polymer Engineering and Science*, Feb., 1974, vol. 14, No. 2, pp. 147–154.
Official Gaz. 1046 TMOG2, Sep. 4, 1984 (Listed on Examiner's 892 form).

*Primary Examiner*—Joseph L. Schofer
*Assistant Examiner*—N. Sarofim
*Attorney, Agent, or Firm*—Gary L. Griswold; Walter N. Kirn; Steven E. Skolnick

[57] ABSTRACT

A pressure sensitive adhesive that includes the polymerization product of:

(a) 25–97 parts by weight of an acrylic acid ester of a monohydric alcohol whose homopolymer has a $T_g$ less than 0° C.;

(b) 3–75 parts by weight of a non-polar ethylenically unsaturated monomer whose homopolymer has a solubility parameter of no greater than 10.50 and a $T_g$ greater than 15° C.; and (c) 0–5 parts by weight of a polar ethylenically unsaturated monomer whose homopolymer has a solubility parameter of greater than 10.50 and a $T_g$ greater than 15° C. The relative amounts of the acrylic acid ester, the non-polar ethylenically unsaturated monomer, and the polar ethylenically unsaturated monomer are chosen such that the 90° peel adhesion of the pressure sensitive adhesive to a polypropylene surface is at least 2 lbs/0.5 in. after a 72 hour dwell at room temperature as measured according to Test Procedure B.

24 Claims, No Drawings

U.S. PATENT DOCUMENTS

| | | |
|---|---|---|
| 4,557,960 | 12/1985 | Vernon et al. . |
| 4,590,230 | 5/1986 | Kamada et al. . |
| 4,599,265 | 7/1986 | Esmay . |
| 4,612,209 | 9/1986 | Forgo et al. . |
| 4,612,242 | 9/1986 | Vesley et al. . |
| 4,618,525 | 10/1986 | Chamberlain et al. . |
| 4,619,867 | 10/1986 | Charbonneau et al. . |
| 4,619,979 | 10/1986 | Kotnour et al. . |
| 4,645,711 | 2/1987 | Winslow et al. . |
| 4,666,771 | 5/1987 | Vesley et al. . |
| 4,673,673 | 6/1987 | Laurent et al. . |
| 4,673,750 | 6/1987 | Beers et al. . |
| 4,693,935 | 9/1987 | Mazurek . |
| 4,699,842 | 10/1987 | Jorgensen et al. . |
| 4,710,536 | 12/1987 | Klingen et al. . |
| 4,731,273 | 3/1988 | Bonk et al. . |
| 4,737,559 | 4/1988 | Kellen et al. . |
| 4,748,061 | 5/1988 | Vesley . |
| 4,749,590 | 6/1988 | Klingen et al. . |
| 4,751,269 | 6/1988 | Bonk et al. . |
| 4,780,491 | 10/1988 | Vesley et al. . |
| 4,818,610 | 4/1989 | Zimmerman et al. . |
| 4,880,683 | 11/1989 | Stow . |
| 4,895,745 | 1/1990 | Vesley et al. . |
| 4,950,537 | 8/1990 | Vesley et al. . |
| 4,988,742 | 1/1991 | Moon et al. . |
| 5,013,784 | 5/1991 | Yang . |
| 5,024,880 | 6/1991 | Ve[a]sley et al. . |
| 5,028,484 | 7/1991 | Martin et al. . |
| 5,086,088 | 2/1992 | Kitano et al. . |
| 5,102,924 | 4/1992 | Williams et al. . |
| 5,106,902 | 4/1992 | Yang . |
| 5,130,375 | 7/1992 | Bernard et al. . |
| 5,141,989 | 8/1992 | Jung et al. . |
| 5,147,938 | 9/1992 | Kuller . |
| 5,156,911 | 10/1992 | Stewart . |
| 5,164,441 | 11/1992 | Yang . |
| 5,262,232 | 11/1993 | Wilfong et al. . |
| 5,278,199 | 1/1994 | Ohkawa et al. . |
| 5,284,891 | 2/1994 | Wouters et al. . |
| 5,308,887 | 5/1994 | Ko et al. . |

PRESSURE SENSITIVE ADHESIVES WITH GOOD LOW ENERGY SURFACE ADHESION

CROSS REFERENCE TO RELATED APPLICATIONS

This is a divisional of application Ser. No. 08/537,034, filed Sep. 29, 1995 now U.S. Pat. No. 5,602,221, which was a continuation of Ser. No. 08/150,425 filed Nov. 10, 1993.

BACKGROUND OF THE INVENTION

1. Field of the Invention

This invention relates to pressure sensitive adhesives.

2. Description of the Background Art

Acrylate pressure sensitive adhesives are well known in the art. Many of these adhesives are copolymers of an alkyl ester of acrylic acid and a minor portion of a polar co-monomer. Due to the presence of the polar co-monomer these adhesives generally do not adhere well to low energy and oily surfaces (e.g., surfaces having a critical surface tension of wetting of no greater than about 35 dynes/cm).

SUMMARY OF THE INVENTION

In general, the invention features a pressure sensitive adhesive that includes the polymerization product of:

(a) 25–97 parts by weight of an acrylic acid ester of a monohydric alcohol whose homopolymer has a $T_g$ less than 0° C.;

(b) 3–75 parts by weight of a non-polar ethylenically unsaturated monomer whose homopolymer has a solubility parameter of no greater than 10.50 and a $T_g$ greater than 15° C.; and (c) 0–5 parts by weight of a polar ethylenically unsaturated monomer whose homopolymer has a solubility parameter of greater than 10.50 and a $T_g$ greater than 15° C. The relative amounts of the acrylic acid ester, the non-polar ethylenically unsaturated monomer, and the polar ethylenically unsaturated monomer are chosen such that the 90° peel adhesion of the pressure sensitive adhesive to a polypropylene surface is at least 2 lbs/0.5 in. after a 72 hour dwell at room temperature as measured according to Test Procedure B, infra.

The solubility parameter referred to herein is calculated according to the technique described in Fedors, Polym. Eng. and Sci., 14:147 (1974). A monomer whose homopolymer has a solubility parameter of greater than 10.50 when measured according to the Fedors technique is referred to herein as a polar monomer, whereas a monomer whose homopolymer has a solubility parameter of 10.50 or less when measured according to the Fedors technique is referred to herein as a non-polar monomer.

The invention provides pressure sensitive adhesives which, by virtue of incorporating a non-polar ethylenically unsaturated monomer and limiting the polar monomer content to no more than 5 parts, exhibit good adhesion to low energy (e.g., plastics such as polyolefin plastics) surfaces. The adhesives exhibit good adhesion to high energy surfaces such as stainless steel as well.

The adhesives are less toxic than, e.g., adhesives containing polar heteroatom acrylates. The adhesives further exhibit good shear properties both at low and high temperatures, particularly when a small amount (no more than 5 parts) of a polar co-monomer is included.

The adhesives offer the further advantage of reduced sensitivity to moisture and reduced tendency to corrode metals such as copper relative to pressure sensitive adhesives containing higher amounts of polar co-monomers. Furthermore, the adhesives interact to a lesser extent with polar additives and increase the solubility of non-polar additives compared to pressure sensitive adhesives containing higher amounts of polar co-monomers.

Other features and advantages of the invention will be apparent from the following description of the preferred embodiments thereof, and from the claims.

DESCRIPTION OF THE PREFERRED EMBODIMENTS

The pressure sensitive adhesives of this invention display good adhesion to both low energy surfaces such as polypropylene and high energy surfaces such as stainless steel. In both cases, the 90° peel strength after a 72 hour dwell is at least 2 lbs/0.5 in., preferably at least 2.5 lbs/0.5 in., and more preferably at least 3 lbs/0.5 in. measured according to Test Procedure B, infra. The adhesives also display good cohesive strength properties as measured by the shear strength. Preferably, the shear strength at both room temperature and 70° C. is greater than 50 minutes, more preferably greater than 1,000 minutes, and even more preferably greater than 10,000 minutes measured according to Test Procedure C, infra. These properties are achieved by controlling the monomeric composition to achieve the appropriate polarity (as measured by the solubility parameter of the homopolymers of the individual monomers determined according to the Fedors technique) and rheological properties ($T_g$ as measured by the 1 radian/second tan delta maximum temperature of the adhesive polymer).

A list of several common monomers and their respective Fedors' solubility parameters is shown in Table 1. Table 1 is subdivided into four sections: low Tg acrylate monomers, high Tg acrylate monomers, high Tg methacrylate monomers, and vinyl monomers.

TABLE 1

| FEDORS' SOLUBILITY PARAMETERS | |
|---|---|
| Repeat Unit | Solubility Parameter $(cal/cm^3)^{0.5}$ |
| Octadecyl acrylate (ODA) | 8.99 |
| Lauryl acrylate (LA) | 9.15 |
| Iso-octyl acrylate (IOA) | 9.22 |
| 2-ethylhexyl acrylate (2-EHA) | 9.22 |
| Butyl acrylate (BA) | 9.77 |
| Propyl acrylate (PA) | 9.95 |
| Ethyl acrylate (EA) | 10.20 |
| 3,3,5 trimethylcyclohexyl acrylate (TMCA) | 9.35 |
| Iso-bornyl acrylate (IBA) | 9.71 |
| Cyclohexyl acrylate (CHA) | 10.16 |
| N-octyl acrylamide (NOA) | 10.33 |
| Tetrahydrofurfuryl acrylate (THFA) | 10.53 |
| Methyl acrylate (MA) | 10.56 |
| Glycidyl acrylate (GA) | 11.32 |
| 2-Phenoxyethylacrylate (2-PhEA) | 11.79 |
| N-vinylcaprolactam (NVC) | 12.10 |
| N,N,-Dimethylacrylamide (DMA) | 12.32 |
| N-vinyl-2-pyrrolidone (NVP) | 13.38 |
| Acrylic Acid (AA) | 14.04 |
| Methylmethacrylate (MMA) | 9.93 |
| Ethylmethacrylate (EMA) | 9.72 |
| Propylmethacrylate (PMA) | 9.57 |

TABLE 1-continued

FEDORS' SOLUBILITY PARAMETERS

| Repeat Unit | Solubility Parameter (cal/cm³)^0.5 |
|---|---|
| Vinyl Acetate | 10.56 |
| Styrene | 11.87 |

The rheological character of the adhesive polymer can be partially but usefully described by the $T_g$ as measured by the 1 radian/second tan delta maximum temperature. It is preferable for the $T_g$ as measured by the 1 radian/second tan delta maximum of the polymer to have a value between −45° C. and 15° C., more preferably between −25° C. and 0° C., and even more preferably between −20° C. and −5° C.

The adhesives according to the invention having the requisite polarity and rheological properties contain 25–97 parts (more preferably 40–85 parts) of an acrylic acid ester whose homopolymer has a $T_g$ less than 0° C. (more preferably less than −20° C.), 3–75 parts (more preferably 15–60 parts) of a non-polar ethylenically unsaturated monomer whose homopolymer has a $T_g$ greater than 15° C., and 0–5 parts (more preferably 0–3 parts) of a polar ethylenically unsaturated monomer whose homopolymer has a $T_g$ greater than 15° C.

The acrylic acid ester is a monofunctional acrylic ester of a monohydric alcohol having from about 4 to about 18 carbon atoms in the alcohol moiety whose homopolymer has a $T_g$ less than 0° C. Included in this class of acrylic acid esters are isooctyl acrylate, 2-ethylhexyl acrylate, isononyl acrylate, isodecyl acrylate, decyl acrylate, lauryl acrylate, hexyl acrylate, butyl acrylate, and octadecyl acrylate, or combinations thereof. In the case of octadecyl acrylate, the amount is chosen such that side chain crystallization does not occur at room temperature.

The non-polar ethylenically-unsaturated monomer is a monomer whose homopolymer has a solubility parameter as measured by the Fedors method of not greater than 10.50 and a $T_g$ greater than 15° C. The non-polar nature of this monomer improves the low energy surface adhesion of the adhesive. It also improves the structural properties of the adhesive (e.g., cohesive strength) relative to a homopolymer of the acrylic acid ester described above. Examples of suitable non-polar monomers include 3,3,5 trimethylcyclohexyl acrylate, cyclohexyl acrylate, isobornyl acrylate, N-octyl acrylamide, t-butyl acrylate, methyl methacrylate, ethyl methacrylate, and propyl methacrylate or combinations thereof.

The adhesive may contain a limited quantity (e.g., no more than 5 parts) of a polar ethylenically unsaturated monomer whose homopolymer has a solubility parameter as measured by the Fedors method of greater than 10.50 and a $T_g$ greater than 15° C. to improve structural properties (e.g., cohesive strength). It is not desirable to include more than 5 parts of the polar monomer because the polar monomer impairs low energy surface adhesion. Examples of suitable polar monomers include acrylic acid, itaconic acid, certain substituted acrylamides such as N,N dimethylacrylamide, N-vinyl-2-pyrrolidone, N-vinyl caprolactam, acrylonitrile, tetrahydrofurfuryl acrylate, glycidyl acrylate, 2-phenoxyethylacrylate, and benzylacrylate, or combinations thereof.

The monomer mixture can be polymerized by various techniques, with photoinitiated bulk polymerization being preferred. An initiator is preferably added to aid in polymerization of the monomers. The type of initiator used depends on the polymerization process. Photoinitiators which are useful for polymerizing the acrylate monomers include benzoin ethers such as benzoin methyl ether or benzoin isopropyl ether, substituted benzoin ethers such as 2-methyl-2-hydroxylpropiophenone, aromatic sulfonyl chlorides such as 2-naphthalenesulfonyl chloride, and photoactive oxides such as 1-phenyl-1, 1-propanedione-2-(o-ethoxycarbonyl)oxime. An example of a commercially available photoinitiator is Irgacure™ 651 available from Ciba-Geigy Corporation, having the formula 2,2-dimethoxy-1,2-diphenylethane-1-one). Generally, the photoinitiator is present in an amount of about 0.005 to 1 weight percent based on the weight of the monomers. Examples of suitable thermal initiators include AIBN and peroxides.

The mixture of the polymerizable monomers may also contain a crosslinking agent, or a combination of crosslinking agents, to increase the shear strength of the adhesive. Useful crosslinking agents include substituted triazines such as 2,4,-bis(trichloromethyl)-6-(4-methoxy phenyl)-s-triazine, 2,4-bis(trichloromethyl)-6-(3,4-dimethoxyphenyl)-s-triazine, and the chromophore-substituted halo-s-triazines disclosed in U.S. Pat. Nos. 4,329,384 and 4,330,590 (Vesley) incorporated herein by reference. Other useful crosslinking agents include multifunctional alkyl acrylate monomers such as trimetholpropane triacrylate, pentaerythritol tetra-acrylate, 1,2 ethylene glycol diacrylate, 1,4 butanediol diacrylate, 1,6 hexanediol diacrylate, and 1,12 dodecanol diacrylate. Various other crosslinking agents with different molecular weights between (meth)acrylate functionality would also be useful. Generally, the crosslinker is present in an amount of about 0.005 to 1 weight percent based on the combined weight of the monomers.

Where a foam-like pressure sensitive adhesive tape is desired, a monomer blend containing microspheres may be used. Suitable microspheres are commercially available from Kema Nord Plastics under the trade name "Expancel" and from Matsumoto Yushi Seiyaku under the trade name "Micropearl". When expanded the microspheres have a specific density of approximately 0.02–0.036 g/cc. It is possible to include the unexpanded microspheres in the pressure sensitive adhesive composition and subsequently heat them to cause expansion when they are appropriately processed, but it is generally preferred to mix the expanded microspheres into the adhesive. This process makes it easier to ensure that the hollow microspheres in the final adhesive are substantially surrounded by at least a thin layer of adhesive.

Polymeric microspheres having an average diameter of 10 to 200 micrometers may be blended into the polymerizable composition in amounts from about 15% to about 75% by volume prior to coating. Also useful are glass microspheres having an average diameter of from 5 to 200 micrometers, preferably from about 20 to 80 micrometers. Such microspheres may comprise 5% to 65% by volume of the pressure sensitive adhesive. Both polymeric and glass microspheres are known in the art. The pressure sensitive adhesive layer of the tape should be at least 3 times as thick as the diameter of the microspheres, preferably at least 7 times.

Other tape constructions in which the pressure sensitive adhesives according to the invention are useful include mechanical fasteners such as Dual-Lock™ brand fastener (Minnesota Mining and Manufacturing Co., St. Paul, Minn.) and Scotchmate™ brand fastener (Minnesota Mining and Manufacturing Co., St. Paul, Minn.). The pressure sensitive adhesives are also useful in vibration damping applications.

Other materials which can be blended with the polymerizable monomers prior to coating include plasticizers, tackifiers, coloring agents, reinforcing agents, fire retardants, foaming agents, thermally conductive agents, electrically conductive agents, post-curing agents, and post-curing agent curatives and their accelerators, and the like.

The pressure sensitive adhesives according to the invention are preferably prepared by photoinitiated bulk polymerization according to the technique described in Martens et al., U.S. Pat. No. 4,181,752, hereby incorporated by reference. The polymerizable monomers and a photoinitiator are mixed together in the absence of solvent and partially polymerized to a viscosity in the range of from about 500 cps to about 50,000 cps to achieve a coatable syrup. Alternatively, the monomers may be mixed with a thixotropic agent such as fumed hydrophilic silica to achieve a coatable thickness. The crosslinking agent and any other ingredients are then added to the prepolymerized syrup. Alternatively, these ingredients (with the exception of the crosslinking agent) can be added directly to the monomer mixture prior to pre-polymerization.

The resulting composition is coated onto a substrate (which may be transparent to ultraviolet radiation) and polymerized in an inert (i.e., oxygen free) atmosphere, e.g., a nitrogen atmosphere by exposure to ultraviolet radiation. Examples of suitable substrates include release liners (e.g., silicone release liners) and tape backings (which may be primed or unprimed paper or plastic). A sufficiently inert atmosphere can also be achieved by covering a layer of the polymerizable coating with a plastic film which is substantially transparent to ultraviolet radiation, and irradiating through that film in air as described in the aforementioned Martens et al. patent using ultraviolet lamps. Alternatively, instead of covering the polymerizable coating, an oxidizable tin compound may be added to the polymerizable syrup to increase the tolerance of the syrup to oxygen as described in U.S. Pat. No. 4,303,485 (Levens). The ultraviolet light source preferably has 90% of the emissions between 280 and 400 nm (more preferably between 300 and 400 nm), with a maximum at 351 nm.

Where multi-layer tape constructions are desirable, one method of construction is multi-layer coating using conventional techniques. For example, the coatings may be applied concurrently (e.g., through a die coater), after which the entire multi-layer structure is cured all at once. The coatings may also be applied sequentially whereby each individual layer is partially or completely cured prior to application of the next layer.

The invention will now be further described by way of the following examples.

EXAMPLES

Test Procedures

Test procedures used in the examples to evaluate pressure sensitive adhesives include the following.

Monomer Conversion Test (Test Procedure A)

The monomer conversion was determined gravimetrically. A sample of the adhesive was weighed after it was coated and subsequently dried at 120° C. for 3 hours and then re-weighed. The percent volatiles was taken to be indicative of the monomer conversion.

90° Peel Adhesion Test (Test Procedure B)

One-half inch wide strips of the adhesive sample were carefully cut and placed onto the substrate of interest. The adhesive thickness was 5 mils. A 5 mil anodized aluminum backing (0.625 in. wide) was then laminated to the adhesive which is approximately 5 inches long. Test substrates of interest included low energy surfaces such as polypropylene (2"×5"×3/16 natural polypropylene panels from Precision Punch and Plastic, Minneapolis, Minn., with a mask on both sides that is removed prior to cleaning and testing) and polycarbonate (Lexan™ from General Electric Co.), and high energy surfaces such as stainless steel (304-2BA 28 gauge stainless steel with a surface roughness of 2.0±1.0 microinches). A free end of the backing to which the adhesive was laminated extended beyond the test substrate so that it could be clamped to a load cell to determine peel strength.

The sample was rolled back and forth twice with a 2 kg hard rubber roller to ensure contact between the adhesive and the test substrate. The adhesive was then removed after a given dwell time (usually 72 hours unless otherwise noted) at 12"/minute in a 90° peel mode.

The stainless steel substrates were washed once with acetone and 3 times with a 50/50 isopropanol/water mixture prior to testing. The plastic substrates were washed 3 times with heptane prior to testing. The results are reported in lbs/0.5 in. width as the average of 2 tests. All tests were conducted at room temperature.

Shear Test (Test Procedure C)

A 0.5 inch strip of tape was adhered to a piece of stainless steel (304-2BA 28 gauge stainless steel with a surface roughness of 2.0±1.0 microinches) which had been cleaned once with acetone and 3 times with 50/50 isopropanol/water such that a one-half square inch overlap was accomplished. A piece of 5 mil anodized aluminum (0.625 in. wide) was then laminated to the entire area of the pressure sensitive adhesive, leaving an additional area to which a load could be applied. The adhesive thickness was 5 mils. The sample was then rolled back and forth twice with a 15 pound roller and allowed to dwell for four hours. The 70° C. samples were allowed to dwell for an additional 10 minutes. After dwelling the sample was tested at either room temperature or 70° C. At room temperature a 1 kg load was applied to the adhesive and the time before the load fell was recorded. At 70° C. a 500 g load was applied to the adhesive and the time before the load fell was recorded. The results are reported as the average of 2 tests.

Comparative Examples

Comparative Example C1

A premix was prepared using 90 parts isooctyl acrylate (IOA), 10 parts acrylic acid (AA), and 0.04 parts 2,2-dimethoxy-2-phenylacetophenone photoinitiator (Irgacure™ 651, available from Ciba Geigy Corp.) This mixture was partially polymerized under a nitrogen-rich atmosphere by exposure to ultraviolet radiation to provide a coatable syrup having a viscosity of about 3000 cps. 0.15 parts of 2,6-bis-trichloromethyl-6-(4-methoxphenyl)-s-triazine and an additional 0.16 parts of Irgacure™ 651 were added to the syrup and it was then knife coated onto a silicone-treated polyethylene-coated paper release liner at a thickness of 5 mils. The resulting composite was then exposed to ultraviolet radiation having a spectral output from 300–400 nm with at maximum at 351 nm in a nitrogen-rich environment. An intensity of about 1.0 mW/cm$^2$ was used for the first one-third of the exposure time and an intensity of about 2.2 mW/cm$^2$ was used for the second two-thirds of exposure time, resulting in a total energy of 250 mJ/cm$^2$. The adhesive was then tested according to the test methods listed above and the results are shown in Table 2. The designation "RT" means room temperature.

Comparative Examples C2 and C3

Comparative example C2 was prepared in the same way as comparative example C1 except that a premix of 94 parts of IOA and 6 parts of AA was used. Comparative example C3 was prepared in the same way as comparative example C1 except that a premix of 100 parts of IOA and 0 parts of AA was used. Comparative examples C2 and C3 were tested according to the test methods listed above and the results are shown in Table 2.

TABLE 2

| Example | Stainless Steel Peel Strength | Polypropylene Peel Strength | R.T. Shear (Minutes) | 70° Shear (minutes) | Percent Conversion |
|---|---|---|---|---|---|
| C1 | 5.33 | 0.43 | 10,000+ | 10,000+ | >98.5% |
| C2 | 3.73 | 1.29 | 10,000+ | 10,000+ | >98.5% |
| C3 | 1.35 | 1.53 | 2 | 3 | >98.5% |

Examples

Examples 1–23

Example 1 was prepared in the same way as comparative example C1 except the premix consisted of 66 parts IOA, 33.5 parts isobornyl acrylate (IBA), and 0.5 parts of AA. In addition, 0.09 parts of 2,6-bis-trichloromethyl-6-(4-methoxyphenyl)-s-triazine were added after the premix was partially polymerized. The composite was exposed to ultraviolet radiation having a spectral output from 300–400 nm with at maximum at 351 nm in a nitrogen-rich environment at an average intensity of about 2.05 mW/cm$^2$. The total energy was 650 mJ/cm$^2$.

Example 2 was prepared in the same way as Example 1 except a premix consisting of 69 parts IOA, 30 parts IBA, and 1 part AA was used.

Example 3 was prepared in the same way Example 1 except a premix consisting of 65.5 parts IOA, 34.25 parts IBA, and 0.25 parts AA was used.

Example 4 was prepared in the same way as Example 1 except a premix consisting of 65 parts IOA and 35 parts IBA was used and 0.05 parts of 2,5-bis-trichloromethyl-6-(4-methoxyphenyl)-s-triazine was used.

Example 5 was prepared in the same way as Example 4 except a premix of 55 parts IOA and 45 parts (3,3,5-trimethylcyclohexyl acrylate (TMCA) was used.

Example 6 was prepared in the same way as Example 5 except 0.10 parts of 2,6-bis-trichloromethyl-4-(p-methoxyphenyl)-s-triazine was used.

Example 7 was prepared in the same way as Example 1 except a premix of 72 parts of IOA, 27 parts of IBA, and 1 part of AA was used.

Example 8 was prepared in the same way as Example 1 except a premix of 66 parts of IOA, 33 parts of IBA, and 1 part of AA was used.

Example 9 was prepared in the same way as Example 1 except a premix of 63 parts of IOA, 36 parts of IBA, and 1 part of AA was used.

Example 10 was prepared in the same way as Example 1 except a premix of 70.75 parts of IOA, 29 parts of TMCA, and 0.25 parts of AA was used.

Example 11 was prepared in the same way as Example 1 except a premix of 64.5 parts of IOA, 35 parts of TMCA, and 0.5 parts of AA was used.

Example 12 was prepared in the same way as Example 1 except a premix of 49 parts of IOA, 51.5 parts of cyclohexyl acrylate (CHA), and 0.5 parts of AA was used.

Example 13 was prepared in the same way as Example 1 except a premix of 80 parts of IOA, 19.5-parts of N-octylacrylamide (NOA), and 0.5 parts of AA was used.

Example 14 was prepared in the same way as Example 6 except a premix of 90 parts IOA, 10 parts IBA, and 0.5 parts AA was used.

Example 15 was prepared in the same way as Example 6 except a premix of 80 parts IOA, 20 parts IBA, and 0.5 parts AA was used.

Example 16 was prepared in the same way as Example 6 except a premix of 70 parts IOA, 30 parts IBA, and 0.5 parts AA was used.

Example 17 was prepared in the same way as Example 6 except a premix of 90 parts IOA, 10 parts TMCA, and 0.5 parts AA was used.

Example 18 was prepared in the same way as Example 6 except a premix of 80 parts IOA, 20 parts TMCA, and 0.5 parts AA was used.

Example 19 was prepared in the same way as Example 6 except a premix of 70 parts IOA, 30 parts TMCA, and 0.5 parts AA was used.

Example 20 was prepared in the same way as Example 6 except a premix of 60 parts IOA, 40 parts TMCA, and 0.5 parts AA was used.

Example 21 was prepared in the same way as Example 6 except a premix of 55 parts IOA, 45 parts TMCA, and 0.5 parts AA was used.

Example 22 was prepared in the same way as Example 6 except a premix of 50 parts IOA, 50 parts CHA, and 0.5 parts AA was used.

Example 23 was prepared in the same way as Example 6 except a premix of 45 parts IOA, 55 parts CHA, and 0.5 parts AA was used.

The data of Examples 1–23 are shown in Table 3. In the table "St. St." refers to stainless steel. The designation "n.t." means not tested. The designation "RT" means room temperature. The designation "(1/2)" means that 1 of the 2 samples tested passed the test. The samples for peel testing in Examples 4 and 5 were prepared using a 15 lb roller. A 24 hr. dwell period was used. Because Examples 13, 14, 17, 18, 22, and 23 do not meet the minimum peel adhesion requirement, they are included here as further comparative examples.

TABLE 3

| Examples | St. St. | Polyprop. | Polycarb. | RT Shear | 70° C. Shear | % Conv. |
| --- | --- | --- | --- | --- | --- | --- |
| 1 | 3.10 | 3.11 | 4.93 | 10K+ | 10K+ | >98.5% |
| 2 | 3.34 | 2.62 | 4.29 | 10K+ | 10K+ | >98.5% |
| 3 | 3.41 | 3.35 | 4.39 | 10K+ | 10K+ | >98.5% |
| 4 | 3.50 | 2.80 | 4.81 | 1409 | 51 | >98.5% |
| 5 | 3.08 | 2.74 | nt | 2960 | 143 | >98.5% |
| 6 | 3.22 | 2.45 | 4.20 | 1138 | 324 | >98.5% |
| 7 | 3.28 | 2.48 | nt | 10K+ | 10K+ | >98.5% |
| 8 | 3.21 | 2.04 | nt | 10K+ | 10K+ | >98.5% |
| 9 | 3.14 | 2.12 | nt | 10K+ | 10K+ | >98.5% |
| 10 | 3.18 | 2.43 | nt | 3375 | 10K+ | >98.5% |
| 11 | 2.39 | 2.08 | 2.92 | 10K+ | 10K+ | >98.5% |
| 12 | 3.56 | 2.52 | 3.68 | 3960 | 10K+ | >98.5% |
| 13 | 2.10 | 1.71 | 2.61 | 2334 | 10K+ | >98.5% |
| 14 | 1.49 | 1.57 | nt | 1207 | 10K+ (1/2) | >98.5% |
| 15 | 1.84 | 1.85 | nt | 3133 | 10K+ | >98.5% |
| 16 | 2.23 | 2.28 | nt | 10K+ (1/2) | 2058 | >98.5% |
| 17 | 1.65 | 1.87 | nt | 1103 | 10K+ | >98.5% |
| 18 | 1.65 | 1.89 | nt | 3747 | 10K+ | >98.5% |
| 19 | 1.89 | 2.16 | nt | 10K+ (1/2) | 10K+ | >98.5% |
| 20 | 2.31 | 2.41 | nt | 10K+ | 10K+ | >98.5% |
| 21 | 1.90 | 2.69 | nt | 10K+ | 10K+ | >98.5% |
| 22 | 2.87 | 1.18 | nt | 10K+ | 10K+ | >98.5% |
| 23 | 3.53 | 0.95 | nt | 10K+ | 10K+ | >98.5% |

The data of Table 3 shows that the adhesion to low energy surfaces like polypropylene can be increased without decreasing the adhesion to high energy surface such as stainless steel as was observed in the comparative examples of Table 2. In addition the data of Table 3 shows that desirable cohesive strength properties can also be achieved in the pressure sensitive adhesives of this invention.

Other embodiments are within the following claims.

What is claimed is:

1. A fastener comprising a hook and loop fastener provided with a pressure sensitive adhesive composition, said pressure sensitive adhesive composition consisting essentially of a pressure sensitive polymer consisting of the reaction product of:

(a) 25–97 parts by weight of an acrylic acid ester of a monohydric alcohol whose homopolymer has a Tg less than 0° C.;

(b) 3–75 parts by weight of a non-polar ethylenically unsaturated monomer whose homopolymer has a solubility parameter of no greater than 10.50 and a Tg greater than 15° C.; and (c) 0–5 parts by weight of a polar ethylenically unsaturated monomer whose homopolymer has a solubility parameter of greater than 10.50 and a Tg greater than 15° C., the relative amounts of said acrylic acid ester, said non-polar ethylenically unsaturated monomer, and said polar ethylenically unsaturated monomer being chosen such that the 90° peel adhesion of said reaction product to a polypropylene surface is at least 2 lbs/0.5 in. after a 72 hour dwell at room temperature as measured according to Test Procedure B, with the proviso that the composition contains essentially no emulsifier.

2. The fastener of claim 1, wherein the relative amounts of said acrylic acid ester, said non-polar ethylenically unsaturated monomer, and said polar ethylenically unsaturated monomer being chosen such that the shear strength of said reaction product at both room temperature and at 70° C. is greater than 50 minutes as measured according to Test Procedure C.

3. The fastener of claim 2, wherein the 1 radian/second tan delta maximum glass transition temperature of said reaction product is between –45° C. and 15° C., inclusive.

4. The fastener of claim 1, wherein said pressure sensitive adhesive comprises the reaction product of said acrylic acid ester, said non-polar ethylenically unsaturated monomer, and 0 parts by weight of said polar ethylenically unsaturated monomer.

5. The fastener of claim 1, wherein said non-polar ethylenically unsaturated monomer is a monomer other than a methacrylate monomer.

6. The fastener of claim 1, wherein said non-polar ethylenically unsaturated monomer is isobornyl acrylate.

7. The fastener of claim 1, wherein said pressure sensitive adhesive comprises the reaction product of isooctyl acrylate, isobornyl acrylate, and acrylic acid.

8. The fastener of claim 1, wherein said pressure sensitive adhesive comprises the reaction product of isooctyl acrylate and isobornyl acrylate.

9. The fastener of claim 1, wherein said pressure sensitive adhesive comprises the reaction product of isooctyl acrylate, N-octyl acrylamide, and acrylic acid.

10. The fastener of claim 1, wherein said pressure sensitive adhesive comprises the reaction product of isooctyl acrylate and 3,3,5-trimethylcyclohexyl acrylate.

11. The fastener of claim 1, wherein said pressure sensitive adhesive comprises the reaction product of isooctyl acrylate, 3,3,5-trimethylcyclohexyl acrylate, and acrylic acid.

12. The fastener of claim 1, wherein said pressure sensitive adhesive comprises the reaction product of isooctyl acrylate, cyclohexyl acrylate, and acrylic acid.

13. A fastener comprising a headed fastener provided with a pressure sensitive adhesive composition, said pressure sensitive adhesive composition consisting essentially of a pressure sensitive polymer consisting of the reaction product of:

(a) 25–97 parts by weight of an acrylic acid ester of a monohydric alcohol whose homopolymer has a Tg less than 0° C.;

(b) 3–75 parts by weight of a non-polar ethylenically unsaturated monomer whose homopolymer has a solubility parameter of no greater than 10.50 and a Tg greater than 15° C.; and (c) 0–5 parts by weight of a polar ethylenically unsaturated monomer whose homopolymer has a solubility parameter of greater than 10.50 and a Tg greater than 15° C., the relative amounts of said acrylic acid ester, said non-polar ethylenically monomer, and said polar ethylenically unsaturated monomer being chosen such that the 90° peel adhesion of said reaction product to a polypropylene surface is at least 2 lbs/0.5 in. after a 72 hour dwell at room temperature as measured according to Test Procedure B, with the proviso that the composition contains essentially no emulsifier.

14. The fastener of claim 13, wherein the relative amounts of said acrylic acid ester, said non-polar ethylenically unsaturated monomer, and said polar ethylenically unsaturated monomer being chosen such that the shear strength of said reaction product at both room temperature and at 70° C. is greater than 50 minutes as measured according to Test Procedure C.

15. The fastener of claim 13, wherein the 1 radian/second tan delta maximum glass transition temperature of said reaction product is between −45° C. and 15° C., inclusive.

16. The fastener of claim 13, wherein said pressure sensitive adhesive comprises the reaction product of said acrylic acid ester, said non-polar ethylenically unsaturated monomer, and 0 parts by weight of said polar ethylenically unsaturated monomer.

17. The fastener of claim 13, wherein said non-polar ethylenically unsaturated monomer is a monomer other than a methacrylate monomer.

18. The fastener of claim 13, wherein said non-polar ethylenically unsaturated monomer is isobornyl acrylate.

19. The fastener of claim 13, wherein said pressure sensitive adhesive comprises the reaction product of isooctyl acrylate, isobornyl acrylate, and acrylic acid.

20. The fastener of claim 13, wherein said pressure sensitive adhesive comprises the reaction product of isooctyl acrylate and isobornyl acrylate.

21. The fastener of claim 13, wherein said pressure sensitive adhesive comprises the reaction product of isooctyl acrylate, N-octyl acrylamide, and acrylic acid.

22. The fastener of claim 13, wherein said pressure sensitive adhesive comprises the reaction product of isooctyl acrylate and 3,3,5-trimethylcyclohexyl acrylate.

23. The fastener of claim 13, wherein said pressure sensitive adhesive comprises the reaction product of isooctyl acrylate, 3,3,5-trimethylcyclohexyl acrylate, and acrylic acid.

24. The fastener of claim 13, wherein said pressure sensitive adhesive comprises the reaction product of isooctyl acrylate, cyclohexyl acrylate, and acrylic acid.

* * * * *

UNITED STATES PATENT AND TRADEMARK OFFICE
CERTIFICATE OF CORRECTION

PATENT NO. : 5,708,110
DATED : January 13, 1998
INVENTOR(S) : Greggory S. Bennett and Christopher A. Haak It is certified that error appears in the above-identified patent and that said Letters Patent is hereby corrected as shown below:

Column 9,
Line 65, "claim 2" should read -- claim 1 --.

Signed and Sealed this

Fourth Day of September, 2001

Attest:

NICHOLAS P. GODICI
Attesting Officer     Acting Director of the United States Patent and Trademark Office